(12) United States Patent
Hsiao et al.

(10) Patent No.: US 11,523,552 B2
(45) Date of Patent: Dec. 6, 2022

(54) AUTOMATIC INSERTION APPARATUS (71) Applicant: DELTA ELECTRONICS, INC., Taoyuan (TW)

(72) Inventors: Yuan-Kun Hsiao, Taoyuan (TW); Jian-Jang Lai, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 98 days.

(21) Appl. No.: 17/224,095

(22) Filed: Apr. 6, 2021

(65) Prior Publication Data
US 2022/0078958 A1 Mar. 10, 2022

(30) Foreign Application Priority Data
Sep. 8, 2020 (CN) .......................... 202010935552.7

(51) Int. Cl.
*H05K 13/08* (2006.01)
*H05K 13/04* (2006.01)

(52) U.S. Cl.
CPC ..... *H05K 13/0812* (2018.08); *H05K 13/0404* (2013.01); *H05K 13/046* (2013.01); *H05K 13/0813* (2018.08); *H05K 13/0815* (2018.08); *Y10T 29/49131* (2015.01); *Y10T 29/53183* (2015.01)

(58) Field of Classification Search
CPC ............. H05K 13/0015; H05K 13/022; H05K 13/024; H05K 13/026; H05K 13/0404; H05K 13/0408; H05K 13/0409; H05K 13/041; H05K 13/0413; H05K 13/046; H05K 13/0812; H05K 13/0813; H05K 13/0815; Y10T 29/4913; Y10T 29/49131; Y10T 29/49133; Y10T 29/49139; Y10T 29/53174; Y10T 29/53183; Y10T 29/53191
See application file for complete search history.

(56) References Cited

U.S. PATENT DOCUMENTS

| | | | | |
|---|---|---|---|---|
| 5,195,821 | A | * 3/1993 | Eguchi | H05K 13/0413 362/89 |
| 5,559,727 | A | * 9/1996 | Deley | H05K 13/0812 356/621 |
| 6,118,538 | A | * 9/2000 | Haugan | H05K 13/0812 250/559.34 |
| 6,434,264 | B1 | 8/2002 | Asar | |
| 2014/0130341 | A1* | 5/2014 | Hung | H05K 13/0015 29/739 |

(Continued)

FOREIGN PATENT DOCUMENTS

| | | |
|---|---|---|
| CN | 100338986 C | 9/2007 |
| CN | 107787177 A | 3/2018 |

(Continued)

*Primary Examiner* — Peter Dungba Vo
*Assistant Examiner* — Joshua D Anderson
(74) *Attorney, Agent, or Firm* — CKC & Partners Co., LLC (57) ABSTRACT

An automatic insertion apparatus includes an actuator, a clamping device, and a light shielding device. The clamping device is connected to the actuator for clamping an electronic component, and the light shielding device is movably connected to the actuator to shield a part of the electronic component, and the light shielding device and the clamping device horizontally moves together with the actuator.

9 Claims, 7 Drawing Sheets

(56) References Cited

U.S. PATENT DOCUMENTS

| | | | |
|---|---|---|---|
| 2017/0131215 A1* | 5/2017 | Hoshikawa | G01N 21/94 |
| 2019/0154436 A1* | 5/2019 | Iwasaki | G01B 11/24 |
| 2019/0269051 A1* | 8/2019 | Tanaka | H05K 13/0413 |
| 2020/0170120 A1* | 5/2020 | Hashimoto | B25J 9/043 |

FOREIGN PATENT DOCUMENTS

| | | |
|---|---|---|
| CN | 108283026 A | 7/2018 |
| CN | 208540384 U | 2/2019 |
| CN | 105453717 B | 5/2019 |
| CN | 106471878 B | 9/2019 |
| CN | 108575053 B | 3/2020 |
| TW | M258855 U | 3/2005 |
| TW | 201730081 A | 9/2017 |

\* cited by examiner

AUTOMATIC INSERTION APPARATUS

RELATED APPLICATIONS

This application claims priority to Chinese Application Serial Number 202010935552.7, filed Sep. 8, 2020, the disclosures of which are incorporated herein by reference in their entireties.

TECHNICAL FIELD

The present disclosure generally relates to an insertion apparatus. More particularly, the present disclosure relates to an automatic insertion apparatus able to recognize positions of electronic component pins.

BACKGROUND

The insertion manufacturing process of printed wiring board assembly (PWBA) is affected by the process parameters such as shape, size, weight, number of pins, insertion position, and insertion accuracy of the electronic components. In order to accurately insert the electronic component pins into the through holes of the printed circuit board, sometimes the insertion process has to be completed by the operators.

As a result, in addition to the problem of manpower consumption, problems such as incorrect insertion, reverse insertion, and missing parts due to manpower assembly may occur. Therefore, the development of automated insertion technology to replace manpower has always been an important issue for industry development.

The recognition technology of the pin positions of the electronic components has always been the important issue of the development of automated insertion technology. At present, a common method of automated insertion technology is to recognize the pin positions through image recognition. First, the pins of the components are taken pictures to obtain the images thereof, and then the images are analyzed to find the positions of the pins. The image quality of the pins has a great influence on the accuracy of the position recognition. How to obtain a good image of the pins to reduce interference, improve the accuracy of the pin recognition, and determine the position of the pins of the components has become the main subject of automated insertion technology development.

In order to get a better pin image, a current method is to use of an image capturing device with an optical grating. The optical grating is fixed above a light source, then the electronic component is moved to the top position of the light source and moved down to make the pins of the electronic component pass through the optical grating, and then the light source is utilized to illuminate the pins of the electronic component to improve the accuracy of the pin recognition.

However, with such an automated insertion technology, the pins of the electronic component have to be moved to the top position of the light source and moved down to approach the light source. At the same time, the pins of the electronic component have to be moved to a suitable height while passing through the optical grating to improve the accuracy of the position recognition of the pins. Therefore, in order to perform the image capture and position recognition of the pins of the aforementioned electronic components, the foregoing steps often cause a bottleneck in the process so as to reduce the insertion efficiency of the automatic insertion apparatus.

SUMMARY

One objective of the embodiments of the present invention is to provide an automatic insertion apparatus able to effectively improve the recognition accuracy and recognition efficiency of the electronic component pins.

To achieve these and other advantages and in accordance with the objective of the embodiments of the present invention, as the embodiment broadly describes herein, the embodiments of the present invention provides an automatic insertion apparatus adapted to clamp an electronic component having a main body and a plurality of pins and recognize positions of the pins. The automatic insertion apparatus includes an actuator having an actuating rod, a clamping device, a light shielding device, and a light source device. The actuator has an actuating rod. The clamping device connects to the actuating rod of the actuator to clamp the electronic component. The light shielding device is disposed under the clamping device to shield the main body of the electronic component and a first height of the pins extending from the main body, and exposes a second height of the pins outside the light shielding.

The light source device has an upper surface and a plurality of lighting elements. The lighting elements emit horizontal lights and non-horizontal lights, and the non-horizontal lights pass through the upper surface to illuminate the second height of the pins. The clamping device vertically moves and clamps the electronic component with the actuating rod of the actuator, and the electronic component is partially accommodated in the light shielding device and horizontally moved to a top position of the light source device.

In addition, the automatic insertion apparatus further includes an image capturing device disposed under the light source device to take a picture of the pins of the electronic component while the electronic component is horizontally moved to the top position of the light source device and the electronic component is higher than the upper surface of the light source device.

In some embodiments, the lighting elements of the light source device are annularly arranged below the upper surface of the light source device.

In some embodiments, the lighting elements of the light source device are arranged in parallel below the upper surface of the light source device.

In some embodiments, the light shielding device includes a ring shaped light shielding element surrounding the clamping device.

In some embodiments, the light shielding device includes a polygonal light shielding element.

In some embodiments, the automatic insertion apparatus further includes a horizontal moving device connecting to the actuator to horizontally move the actuator, the light shielding device, the clamping device and the electronic component.

In some embodiments, the clamping device includes a gripper or a suction nozzle.

In some embodiments, an inner diameter of the light shielding device is larger than a maximum size of the electronic component about 30%.

Hence, the light shielding device of the automatic insertion apparatus can move together with the clamping device. While taking pictures of the pins of the electronic component, the electronic component is only necessary to horizontally move to the top of the image capturing device so as to improve the efficiency and quality of the automatic insertion apparatus. Therefore, the efficiency and quality of the automatic insertion apparatus can be effectively improved.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present disclosure. This description is not to be taken in a limiting sense but is made merely for the purpose of describing the general principles of the invention. The scope of the invention should be determined by referencing the appended claims.

Figure 1:
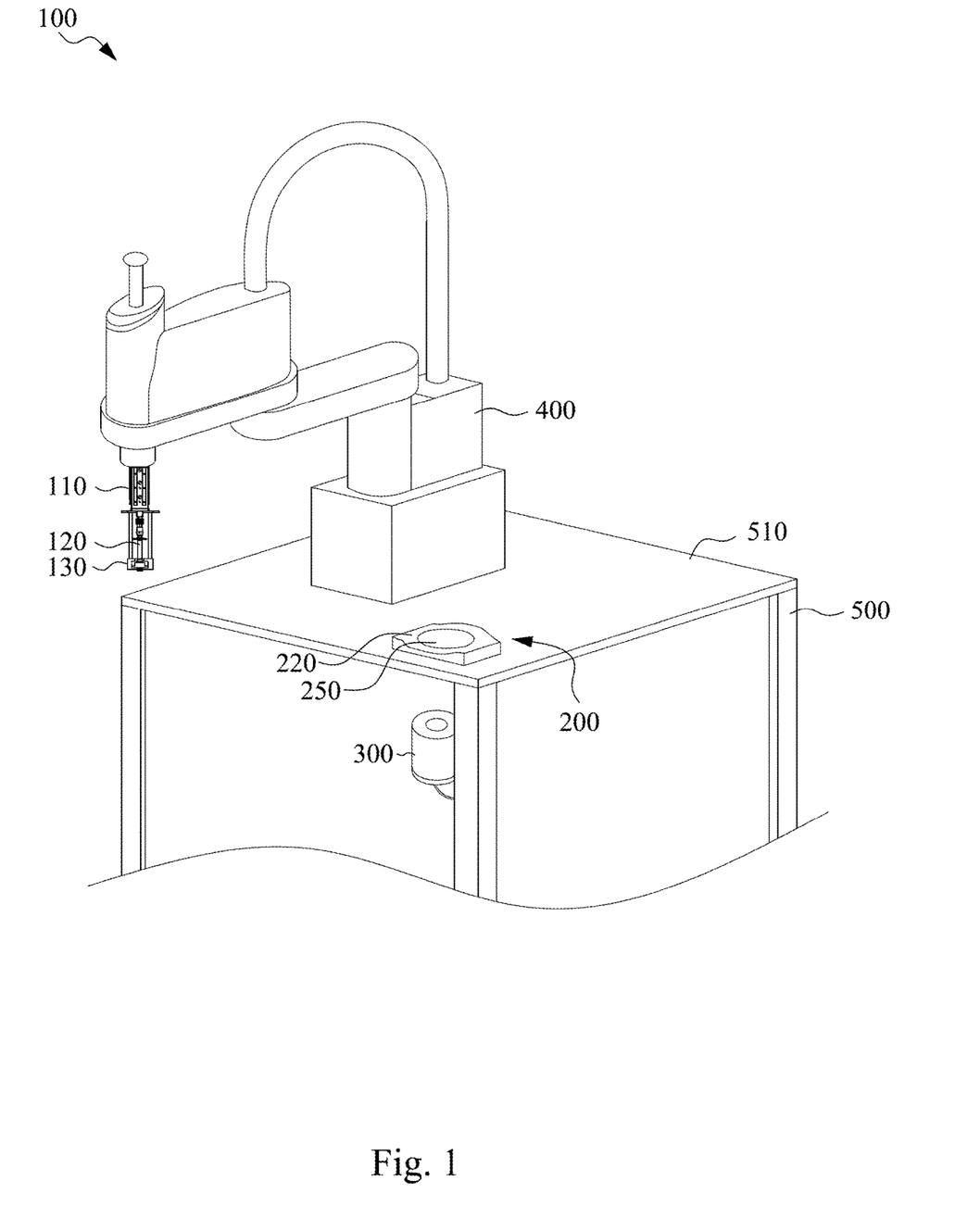
FIG. 1 illustrates a schematic perspective view showing an automatic insertion apparatus according to one embodiment of the present invention.
Figure 2:
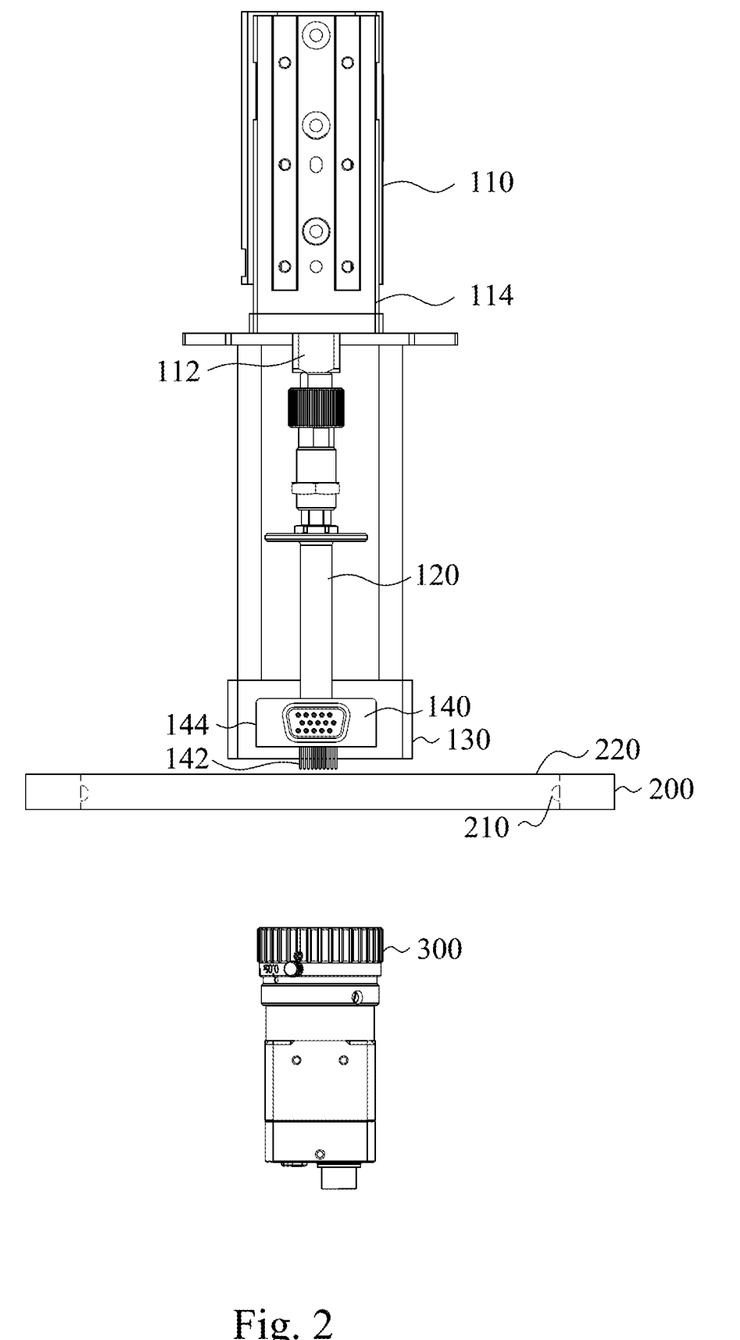
FIG. 2 illustrates a schematic partial enlarged view showing an automatic insertion apparatus according to one embodiment of the present invention.
Figure 3:
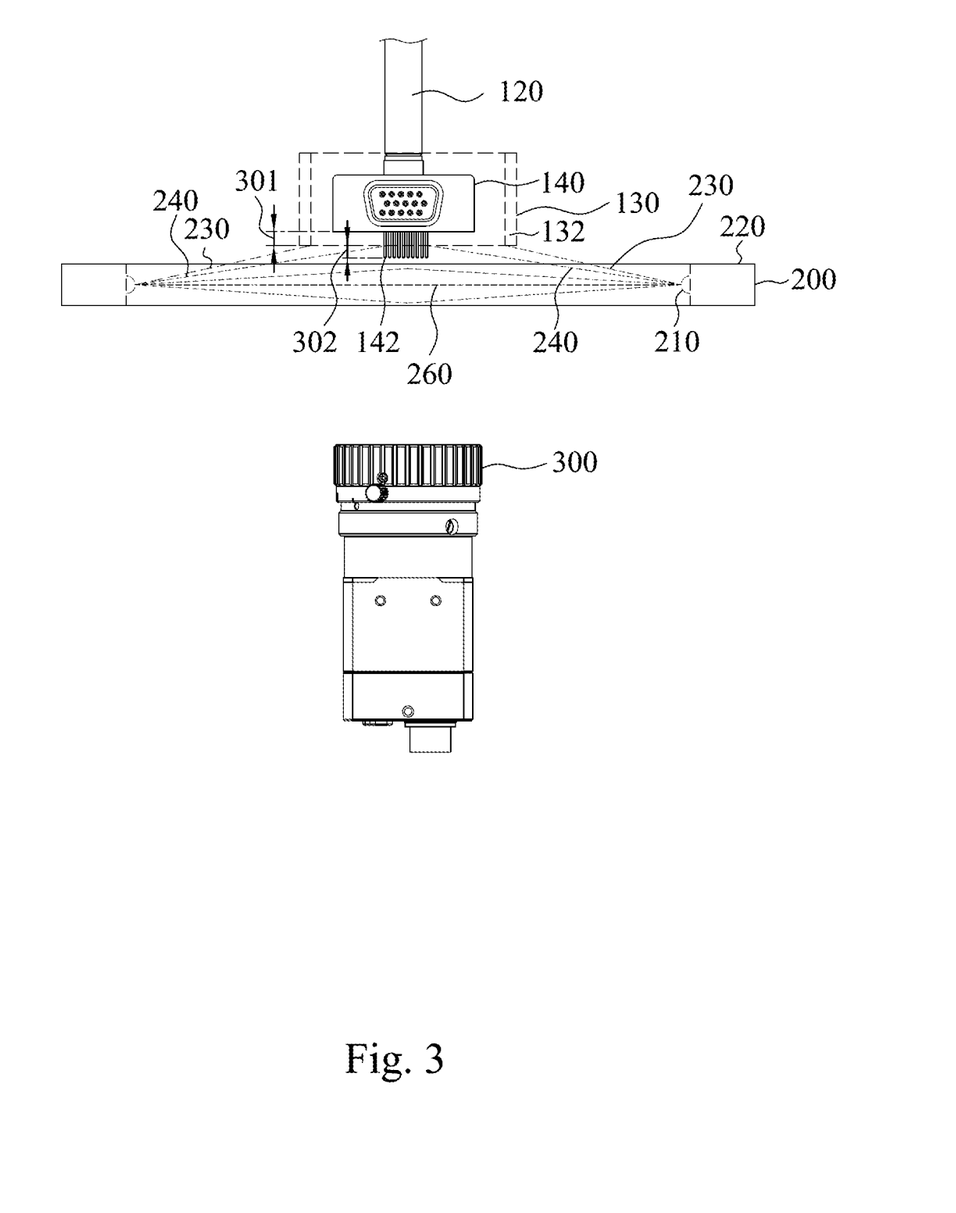
FIG. 3 illustrates a schematic partial enlarged view showing an automatic insertion apparatus according to one embodiment of the present invention to demonstrate that the lights illuminate the pins of the electronic component.
Figure 4:
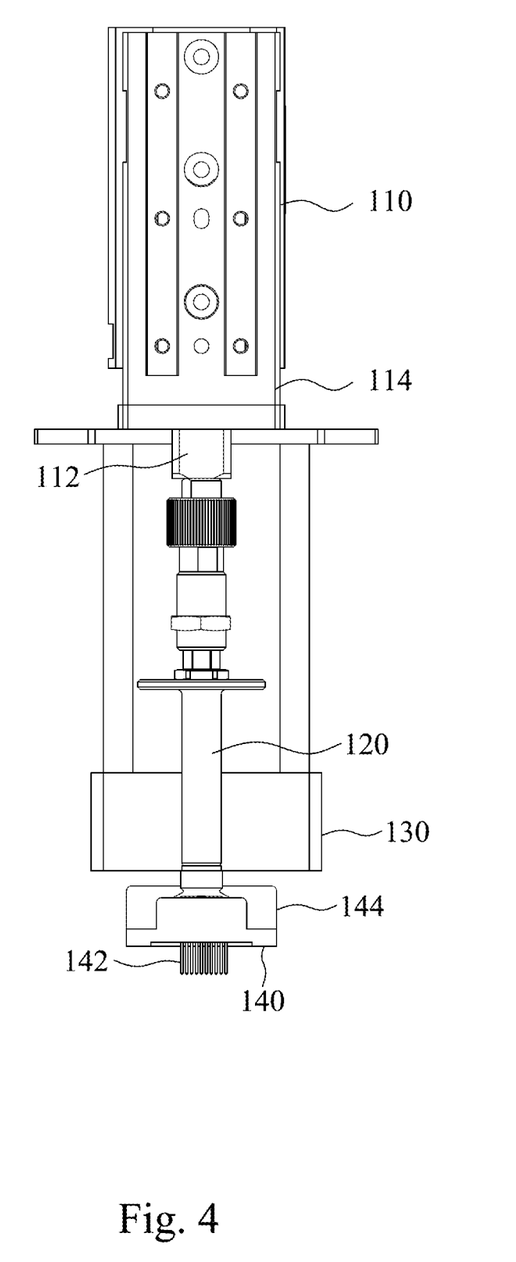
FIG. 4 illustrates a schematic partial enlarged view showing an automatic insertion apparatus according to one embodiment of the present invention to demonstrate that a clamping device clamps an electronic component.
Figure 5:
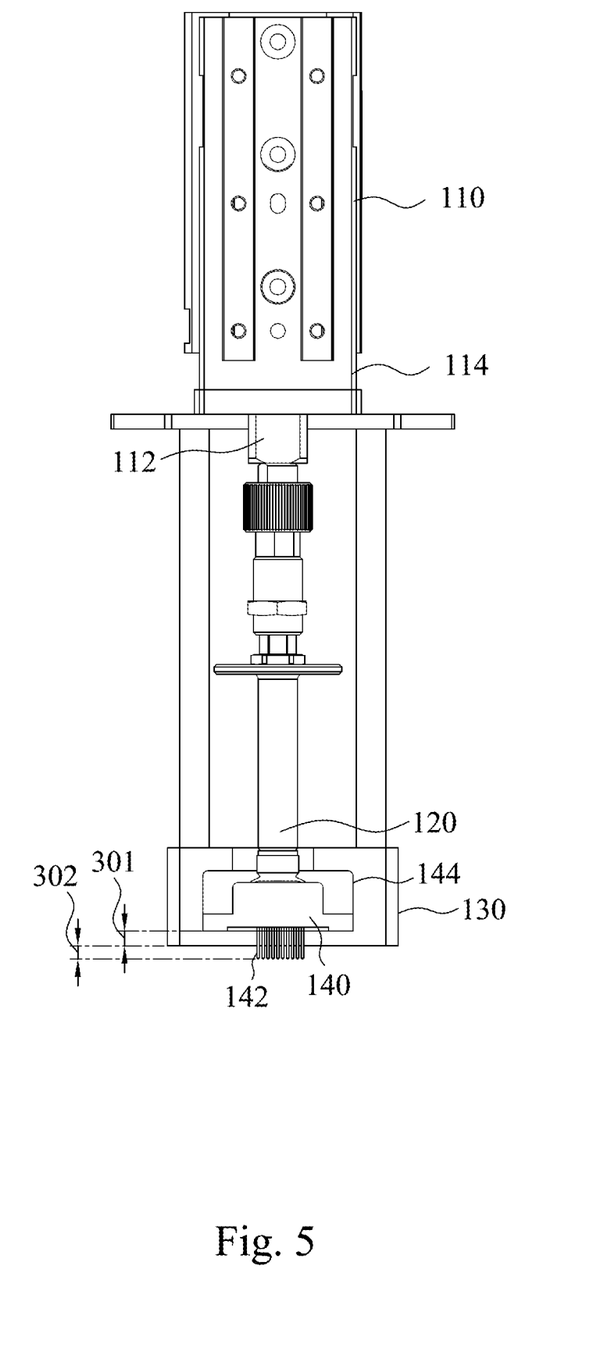
FIG. 5 illustrates a schematic partial enlarged view showing an automatic insertion apparatus according to one embodiment of the present invention to demonstrate that the relative locations of an electronic component and a light shielding device when a clamping device clamps the electronic component for recognizing the positions of the pins of the electronic component.
Figure 6:
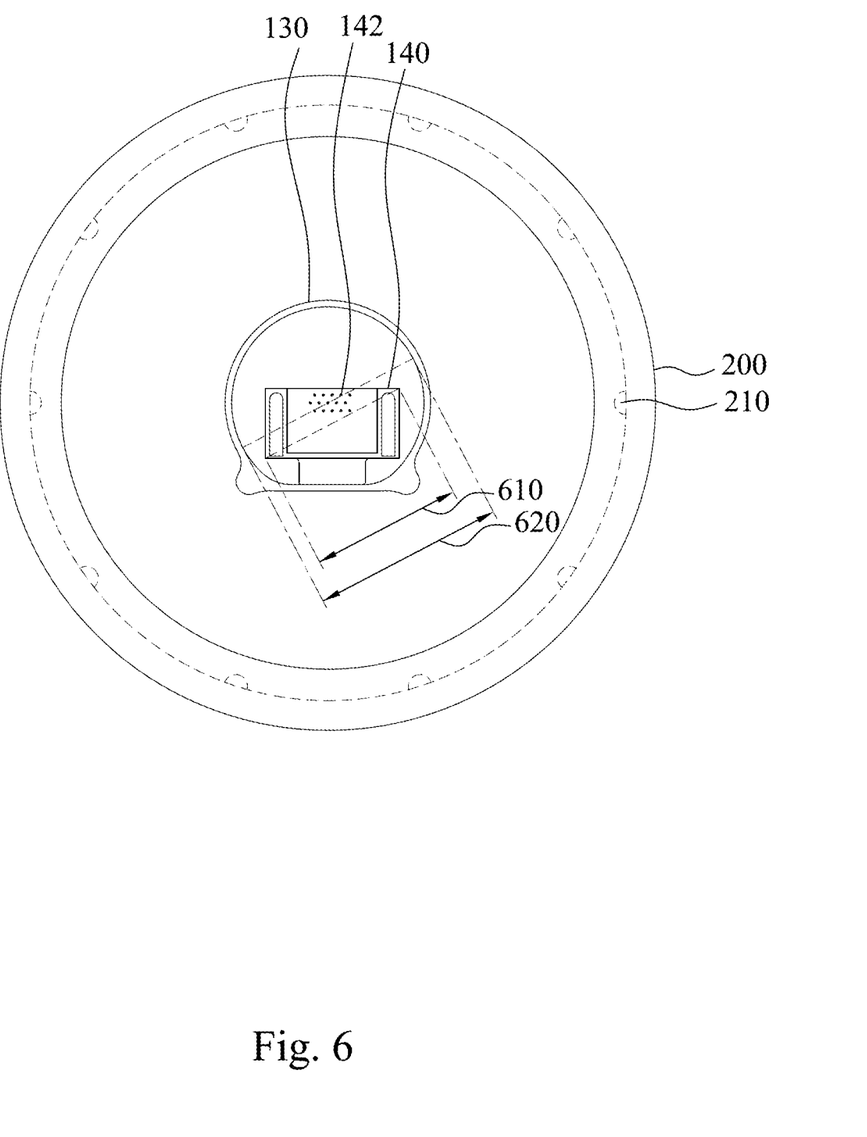
FIG. 6 illustrates a schematic view showing a light shielding device of an automatic insertion apparatus according to one embodiment of the present invention.
Figure 7:
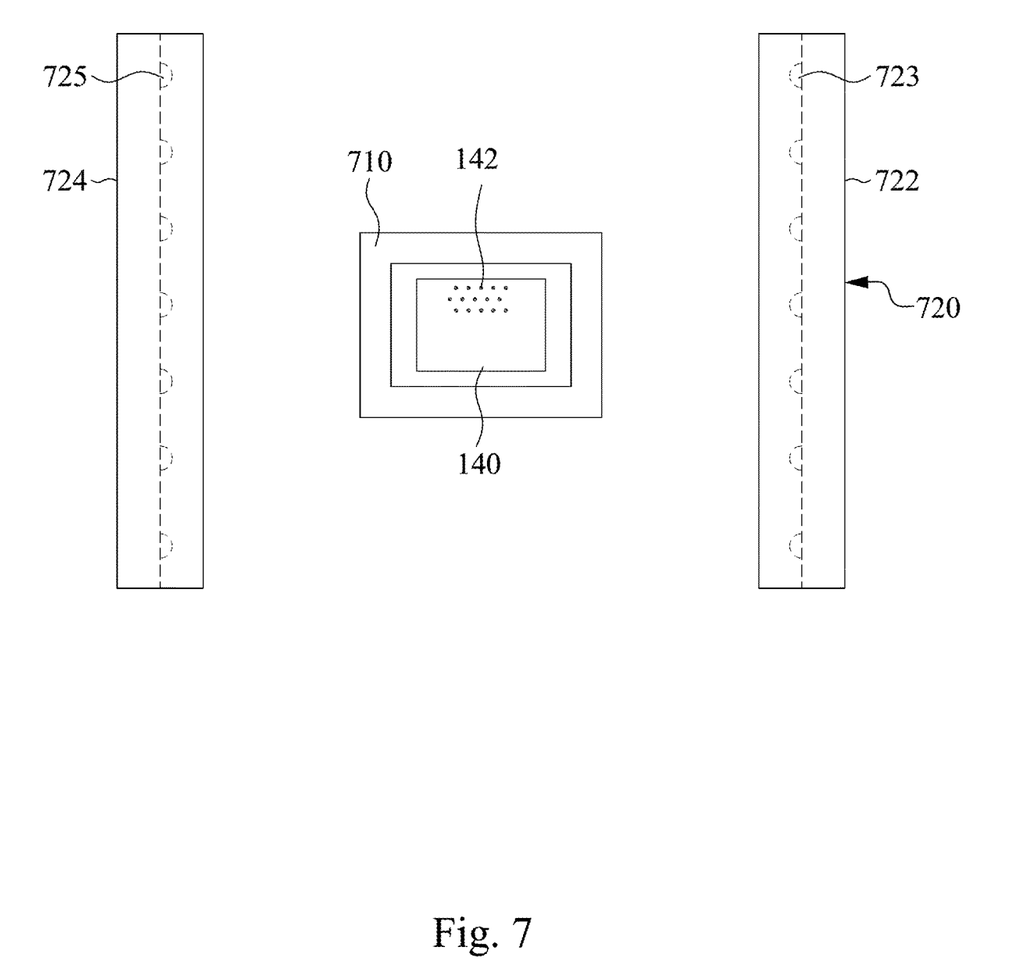
FIG. 7 illustrates a schematic view showing a light shielding device of an automatic insertion apparatus according to another embodiment of the present invention.

FIG. 1 is a schematic perspective view of an automatic insertion apparatus according to one embodiment of the present invention, FIG. 2 is a schematic partial enlarged view thereof, FIG. 3 illustrates the light path for illuminating the pins of the electronic component, FIG. 4 illustrates a clamping device clamps the electronic component, FIG. 5 illustrates the relative locations of the electronic component and the light shielding device when the clamping device clamps the electronic component for recognizing the positions of the pins of the electronic component, FIG. 6 illustrates one embodiment of the light shielding device, and FIG. 7 illustrates another embodiment of the light shielding device.

Referring to FIG. 1 to FIG. 3, an automatic insertion apparatus 100 includes an actuator 110, a clamping device 120 and a light shielding device 130.

The clamping device 120 is connected to an actuating rod 112 of the actuator 110 to vertically move and clamp an electronic component 140. In addition, the light shielding device 130 is connected to a shell 114 of the actuator 110 to shield a part of the electronic component 140 including a first height 301 of pins 142.

The automatic insertion apparatus 100 further includes a horizontal moving device 400, a base 500, a light source device 200 and an image capturing device 300. The horizontal moving device 400 is fixed on the upper base surface 510 of the base 500 to horizontally move the actuator 110, the light shielding device 130, the clamping device 120 and a clamped electronic component 140. The light source device 200 is disposed on the upper base surface 510 of the base 500 to illuminate a part of the electronic component 140, e.g. a second height 302 of the pins 142 of the electronic component 140, with non-horizontal lights, and the light shielding device 130 shields the first height 301 of the pins 142 and the main body 144 of the electronic component 140. In addition, the image capturing device 300 is disposed under the light source device 200 to take pictures of the pins 142 of the electronic component 140 through the opening 250 and further precisely recognizes the positions of the pins 142. In addition, the light shielding device 130 can be directly connected to the horizontal moving device 400 to horizontally move with the horizontal moving device 400.

Referring to FIG. 2, it is worth noting that the light source device 200 includes an upper surface 220 and a plurality of lighting elements 210. Simultaneously referring to FIG. 3, non-horizontal lights 230 and non-horizontal lights 240 emitted by the lighting elements 210 may pass through the upper surface 220 to illuminate the pins 142 of the electronic component 140. In addition, horizontal lights 260 emitted by the lighting elements 210 do not pass through the upper surface 220. In some embodiments, the non-horizontal lights 230 of the lighting elements 210 may shield by the light shielding wall 132 of the light shielding device 130, and the non-horizontal lights 240 may radiate directly to the pins 142 of the electronic component 140. Therefore, the pins 142 of the electronic component 140 can be brightly illuminated by the non-horizontal lights 240. However, the other parts of the electronic component 140, e.g. the main body 144, not necessary to be recognized, can be hidden in the light shielding device 130. Therefore, only the pins 142 are exposed outside the light shielding device 130, and the light shielding wall 132 of the light shielding device 130 can effectively block some lights from radiating to the parts other than the pins 142 to prevent from the parts other than the pins 142 to be illuminated so as to reduce the influence on the pin recognition accuracy due to the image of the parts other than the pins 142 of the electronic component 140. In some embodiments, at least a portion of the pins 142 is exposed outside of the light shielding device 130, for example, at least 20% of the length of the pins is exposed outside of the light shielding device 130. In addition, the non-horizontal lights 240 may radiate to the exposed portion of the pins 142 of the electronic component 140.

It is further worth noting that the light shielding device 130 of the automatic insertion apparatus 100 shields a part of the electronic component 140 and is connected to the shell 114 of the actuator 110 or the horizontal moving device 400. In addition, the light shielding device 130 and the clamping device 120 are both moved horizontally with the actuator 110 by the horizontal moving device 400.

While capturing the image and recognizing positions of the pins 142, the electronic component 140 horizontally moves to the top position of the light source device 200 and the electronic component 140 is located higher than the upper surface 220 of the light source device 200. At the moment, the pins 142 of the electronic component 140 can be taken photos without downward moving toward the light source device 200 when the electronic component 140 is moved to the top position of the light source device 200. Hence, the automatic insertion apparatus 100 can achieve an aerial photography that the pins 142 of the electronic component 140 can be taken photos without adjusting the height between the pins 142 and the image capturing device 300 while the electronic component 140 is located above the light source device 200 so as to effectively improve the photo efficiency of the pins 142 of the electronic component 140.

In some embodiments, the clamping device 120 includes a gripper or a suction nozzle to hold the electronic component 140.

Referring to FIG. 4, the light shielding device 130 can be retracted relative to the clamping device 120 for clamping the electronic component 140, so as to expose the clamping device 120 outside the light shielding device 130, thereby conveniently clamping the electronic component 140.

Further referring to FIG. 5, after the electronic component 140 is clamped, the light shielding device 130 can move forward relative to the clamping device 120 so as to only expose a part of the electronic component 140, i.e. pins 142, outside the light shielding device 130. At the same time, the actuator 110, the clamping device 120, the light shielding device 130 and the electronic component 140 are simultaneously moved to the top position of the light source device 200 by the horizontal moving device 400 and take pictures without adjusting the height of the pins 142 of the electronic component 140 so as to improve the recognition efficiency of the pins 142 of the electronic component 140.

In some embodiments, a plurality of actuators 110, clamping devices 120 and light shielding devices 130 can be installed on the horizontal moving device 400 to simultaneously clamp and photograph a plurality of electronic components 140 without departing from the spirit and the scope of the invention.

Referring FIG. 3 and FIG. 6, the lighting elements 210 of the light source device 200 are disposed under the upper surface 220 of the light source device 200. In some embodiments, the light shielding device 130 is a ring shaped light shielding element surrounding the clamping device 120. In some embodiments, the light shielding device 130 is a triangular, quadrangular, pentagonal and other polygonal light shielding element, or a circular, semicircular or elliptical light shielding element without departing from the spirit and the scope of the invention.

In some embodiments, the inner diameter 620 of the light shielding device 130 is larger than the electronic component size 610. Preferably, the inner diameter 620 of the light shielding device 130 is larger than 30% of the maximum size of the electronic component 140. For example, as shown in FIG. 6, the maximum size of electronic component 140 is the diagonal of the electronic component 140, marked as the component size 610, so that the light shielding device 130 can accommodate a larger-sized electronic component 140 and effectively shield the main body thereof.

Referring to FIG. 7, another embodiment of the light source device is illustrated. The light source device 720 includes a first light generator 722 and a second light generator 724, and a plurality of first lighting elements 723 are disposed on the first light generator 722, and a plurality of second lighting elements 725 are disposed on the second light generator 724. The first lighting elements 723 and the second lighting elements 725 are disposed in parallel, and the first lighting elements 723 and the second lighting elements 725 are also disposed under the upper surface of the light source device similar to the configuration shown in FIG. 3. In some embodiments, the lighting elements can be a variety of light-emitting elements such as light-emitting diodes without departing from the spirit and the scope of the invention.

The light shielding device 710 can also be a ring shaped light shielding element, for example, a triangular, quadrangular, pentagonal and other polygonal light shielding element, or a circular, semicircular or elliptical light shielding element without departing from the spirit and the scope of the invention. In some embodiments, the light source device and the light shielding device can be changed according to the appearance and shape of the electronic component to be recognized without departing from the spirit and the scope of the invention.

Accordingly, the light shielding device of the automatic insertion apparatus can move together with the clamping device. While taking pictures of the pins of the electronic component, the electronic component is only necessary to move to the top of the image capturing device and the pins of the electronic component 140 are not necessary to downward enter into an optical grating fixed on the light source. Therefore, the automatic insertion apparatus can simplify the photographing processes of the pins of the electronic component, and no need for frequent acceleration, deceleration and positioning steps, so as to effectively solve the problem of photographing fragmentation, thereby greatly improving the overall photographing efficiency.

In addition, the light shielding device surrounds the clamping device, so that the clamping device is located inside the light shielding device. The clamping device can move together with the light shielding device and the size and shape of the light shielding device can be changed according to the size and shape of the electronic component to be recognized. Therefore, the light shielding device of the automatic insertion apparatus can quick positioning to maintain the position relationship between the light shielding device and the electronic component.

When the automatic insertion apparatus takes pictures of the pins of the electronic component, the electronic component is not necessary to firstly move to the light source device and then adjust the altitude of the pins to position the pins at a correct illumination position of the light source device. The automatic insertion apparatus can move and take pictures of the pins of the electronic component on the same height plane, thereby realizing the aerial photography function of the pins of the electronic component. In addition, the automatic insertion apparatus can effectively solve the problem of low efficiency in taking pictures of the pins of the electronic component so as to effectively improve the efficiency and accuracy of the pin recognition for the electronic components.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. An automatic insertion apparatus, adapted to clamp an electronic component having a main body and a plurality of pins and recognize positions of the pins, the automatic insertion apparatus comprising:

an actuator having an actuating rod;

a clamping device connecting to the actuating rod of the actuator to clamp the electronic component;

a light shielding device disposed under the clamping device to shield the main body of the electronic component clamped by the clamping device and a first height of the pins extending from the main body and expose a second height of the pins outside the light shielding device; and a light source device having an upper surface and a plurality of lighting elements, wherein the lighting elements emit horizontal lights and non-horizontal lights, and the non-horizontal lights pass through the upper surface to illuminate the second height of the pins exposed by the light shielding device, wherein the clamping device vertically moves and clamps the electronic component with the actuating rod of the actuator such that the electronic component is partially accommodated in the light shielding device and horizontally moved with the light shielding device to a top position of the light source device above the upper surface of the light source device for recognizing positions of the pins.

2. The automatic insertion apparatus of claim 1, further comprising:

an image capturing device disposed under the light source device to take a picture of the pins of the electronic component while the electronic component is horizontally moved to the top position of the light source device and the electronic component is higher than the upper surface of the light source device.

3. The automatic insertion apparatus of claim 1, wherein the lighting elements of the light source device are annularly arranged below the upper surface of the light source device.

4. The automatic insertion apparatus of claim 1, wherein the lighting elements of the light source device are arranged in parallel below the upper surface of the light source device.

5. The automatic insertion apparatus of claim 1, wherein the light shielding device comprises a ring shaped light shielding element surrounding the clamping device.

6. The automatic insertion apparatus of claim 1, wherein the light shielding device comprises a polygonal light shielding element.

7. The automatic insertion apparatus of claim 1, further comprising a horizontal moving device connecting to the actuator to horizontally move the actuator, the light shielding device, the clamping device and the electronic component.

8. The automatic insertion apparatus of claim 1, wherein the clamping device comprises a gripper or a suction nozzle.

9. The automatic insertion apparatus of claim 1, wherein an inner diameter of the light shielding device is larger than a maximum size of the electronic component by at least 30%.

* * * * *